United States Patent
Shimizu et al.

Patent Number: 5,920,079
Date of Patent: *Jul. 6, 1999

[54] SEMICONDUCTIVE LIGHT-EMITTING DEVICE HAVING STRAINED MQW WITH ALGAINAS BARRIERS

[75] Inventors: Hitoshi Shimizu; Kazuaki Nishikata; Toru Fukushima; Michinori Irikawa, all of Tokyo, Japan

[73] Assignee: The Furukawa Electric Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/572,101

[22] Filed: Dec. 14, 1995

[30] Foreign Application Priority Data

Dec. 16, 1994 [JP] Japan .................................. 6-313165

[51] Int. Cl.$^6$ ...................... H01L 29/06; H01L 31/0328; H01L 33/00
[52] U.S. Cl. ................................ 257/18; 257/97; 372/45; 372/47
[58] Field of Search ............................ 257/18, 192, 194, 257/97; 372/45, 46, 47

[56] References Cited

U.S. PATENT DOCUMENTS

| | | |
|---|---|---|
| 4,797,716 | 1/1989 | Chaffin ........................ 257/18 |
| 5,068,867 | 4/1991 | Hasenberg et al. .......................... 257/18 |
| 5,363,393 | 11/1994 | Uomi et al. ................................. 372/45 |
| 5,381,434 | 1/1995 | Bhat et al. ................................... 372/45 |
| 5,574,289 | 11/1996 | Aoki et al. .................................... 257/17 |
| 5,583,878 | 12/1996 | Shimizu et al. ............................ 372/45 |
| 5,585,957 | 12/1996 | Nakao et al. ............................. 359/248 |

*Primary Examiner*—Ngân V. Ngô
*Attorney, Agent, or Firm*—Jacobson, Price, Holman & Stern, PLLC

[57] ABSTRACT

The present invention provides a semiconductive light-emitting device involving a light-emitting layer of the multilayer strained quantum well structure that has a plurality of quantum well layers and a plurality of barrier layers, where each of said quantum well layers is constituted of a semiconductive crystal subjected to intraplanar compressive strain; each of the barrier layers is constituted of semiconductor crystal of AlInAs, AlGaInAs or AlGaInAsP. For high differential gain, each quantum well layer is 6nm thick or less, and the summed quantum well layers measure 13 to 1000 nm in thickness. Likewise, the invented scheme produces a light-emitting device involving a light-emitting layer of the multilayer strain compensation quantum well structure that has a plurality of quantum well layers and a plurality of barrier layers, where each of said quantum well layers is constituted of a semiconductive crystal subjected to intraplanar compressive strain; each of the barrier layers is constituted of semiconductor crystal of AlInAs, AlGaInAs or AlGaInAsP. For high differential gain, each quantum well layer is 6nm thick or less, and the summed quantum well layers measure 13 to 1000 nm in thickness.

17 Claims, 4 Drawing Sheets

SEMICONDUCTIVE LIGHT-EMITTING DEVICE HAVING STRAINED MQW WITH ALGAINAS BARRIERS

BACKGROUND OF THE INVENTION

1. Field of the Invention

This invention relates to an improved semiconductive light-emitting device comprising a light-emitting layer having a strained multi-quantum well or strain compensation type multilayer quantum well structure and a light emission wavelength between 1.30 and 1.65 μm.

2. Background of the Invention

Semiconductor light-emitting device comprising a light-emitting layer having a strained multilayer quantum well or strain compensation type multilayer quantum well structure and a light emission wavelength band between 1.30 and 1.65 μm are well known. The light-emitting layer is constituted of quantum well layers and barrier layers and each of the quantum well layers and barrier layers is made of GaInAs or GaInAsP. The upper and lower optical confining layers are respectively arranged on and beneath the light-emitting layer to sandwich it. A pair of InP cladding layers are disposed respectively on and beneath the upper and lower optical confining layers.

While a bulk crystal structure has been traditionally used for the light-emitting layer of a semiconductive light-emitting device, it has been replaced more often than one by a multilayer quantum well or strained quantum well structure in recent years. An improved differential gain is available if a multilayer quantum well structure is used for the light emitting layer because of the stepped state density specific to such a structure. An even more improved differential gain is achievable if a strained quantum well structure is used for the light-emitting layer because of an improved symmetry and a reduced state density of the valence band. As is well known in this technical field, the differential gain is a factor that vitally affects the characteristics of laser including the maximum modulation frequency and the relative intensity noise as well as the chirping and the emission spectrum width, if the laser is a distributed feedback type semiconductive.

Problems to be Solved by the Invention

While some of the advantages of using a multilayer quantum well of strained quantum well structure for a light-emitting layer are discussed above, it is vitally important for such a light-emitting layer to minimize the probability with which electrons injected into the quantum well layers are, by turn, emitted to the barrier layers and the optical confining layers as a result of thermal emission. The probability of the thermal emission $(1/\tau_t)$ is expressed by the formula below.

$$1/\tau_t = 2\left(\frac{k_B T}{2\pi m*(\Sigma L_w)^2}\right)^{1/2} \exp\left(-\frac{E_B}{k_B T}\right)$$

where $k_B$ is the Boltzman constant, T is the temperature, m* is effective mass of an electron, $\Sigma L_w$ is the total thickness of the quantum well layers and EB is the effective barrier height.

As is clear from the above equation, the smaller ELw and EB are the larger $1/\tau_t$. In other words, the total thickness of the quantum well layers and the height of the effective barrier height are desirably made as large as possible in order to obtain a large differential gain. However, if the light-emitting layer is constituted of GaInAs or GaInAsP quantum well layers and GaInAs or GaInAsP barrier layers, the effective barrier height is inevitably low and is not capable of producing a satisfactorily large differential gain because the conduction band offset expressed by $[\Delta E_c/(\Delta E_{c+}(\Delta E_v)]$ is as small as 0.4.

If, on the other hand, the light-emitting layer comprises strained quantum well layers, the differential gain is theoretically predicted to become larger than that of the lattice-matching type, and is expected to be of a value between $40 \times 10^{-16}$ and $60 \times 10^{-16}$ cm². However, since the strained quantum well structure is set under restraint in terms of lasing wavelength, critical film thickness and other factors, the well width has to be made as small as 2 to 4 nm while the number of quantum well layers is limited to 5 at maximum.

Thus, a strained quantum well with a narrower well width and a smaller number of quantum well layer results in a raised possibility of the injected electrons being released toward the barrier layers and optical confinement layers due to thermal emission, where a differential gain isn't improved as expected.

Consequently, as for such a semiconductive light-emitting device, the probability with which the injected electrons are released from the quantum well layers toward the barrier layers and optical confinement layers due to thermal emission decreases, thereby raising the differential gain as anticipated.

Moreover, thinner quantum well layers are provided for a semiconductor light-emitting device according to the present invention, where a quantum effect becomes large and a gain gradient to injected carrier density increases, thereby producing a fairly large differential gain.

Referring to FIG. 2, n-InP substrate 1 includes $2 \times 10^{18}$ n-type impurities per 1 cm³. On the n-InP substrate 1, one selected out of MBE, gas source CBE and MOCVD methods stratify in sequence, n-InP lower cladding layer 2 (1 μm thick, including $1 \times 10^{18}$ n-type impurities per 1 cm³), n-Al$_{0.30}$Ga$_{0.17}$In$_{0.53}$As lower confinement layer 3 (50–200 nm thick, including $2 \times 10^{17}$ n-type impurities per 1 cm³), strain compensation multilayer quantum well structure 4, p-Al$_{0.30}$Ga$_{0.17}$In$_{0.53}$As upper confinement layer 5 (50–200 nm thick, including $2 \times 10^{17}$ p-type impurities per 1 cm³) and p-InP upper cladding layer 6 (1 μm thick, including $1 \times 10^{18}$ p-type impurities per 1 cm³).

In the present invention as detailed above, a semiconductive light-emitting device involving a light-emitting layer in which a multilayer strained quantum well structure or a strain compensation multilayer quantum well structure is included, is thicker in summed layers, and higher in effective barrier layers, where a less probability, with which the injected electrons are released from the quantum well layers, toward the barrier layers and optical confinement layers due to thermal emission results in an adequately raised differential gain.

As can be appreciated from the above description, this is due to a small total film thickness of the strained quantum well layers, which by turn raises the threshold carrier density and the extent of band filling, thereby decreasing the effective barrier height. While strain compensation quantum well structures have been proposed and tentatively prepared in an attempt to increase the total film thickness of the strained quantum well layers of a light-emitting device, no semiconductive light-emitting device that can produce a satisfactory differential gain has been known to date.

FIG. 7 of the accompanying drawings is a graph illustrating the relationship between the total thickness of the quantum well layers and the differential gain of a known semiconductive light-emitting device comprising a light-emitting layer constituted of GaInAs or GaInAsP quantum well layers and GaInAs or GaInAsP barrier layers. As seen from FIG. 7, the differential gain of a strained quantum well structure shows the maximum value of $5 \times 10^{16}$ cm$^2$ for a total film thickness of 30 nm of the quantum well layers, which is slightly below the critical film thickness, whereas that of a strain compensation type quantum well structure shows a value of $7.5 \times 10^{-16}$ cm$^2$ for a total thickness from 60 to 160 nm of the quantum well layers. The corresponding value of a latticematching type device is also $4 \times 10^{-16}$ cm$^2$ for a total thickness from 50 to 160 nm of the quantum well layers. The relatively low values of the differential gain reveals that semiconductive light-emitting devices are likely to be improved particularly in terms of differential gain.

In view of the above identified technological problems, it is therefore the object of the present invention to provide a semiconductive light-emitting device that can show an improved differential gain.

SUMMARY OF THE INVENTION

According to an aspect of the invention, the above object is achieved by providing a semiconductive light-emitting device comprising a light-emitting layer of a multilayer strained quantum well structure having a plurality of quantum well layers and a plurality of barrier layers, each of said quantum well layers being constituted of a semiconductor crystal subjected to intraplanar compressive strain, each of the barrier layers being constituted by a semiconductor crystal of AlInAs, AlGaInAs or AlGaInAsP, characterized in that each of the quantum well layers has a thickness equal to or smaller than 6 nm and the total thickness of the quantum well layers is between 13 and 1,000 nm.

There is also provided a semiconductive light-emitting device comprising a light emitting layer of a strain compensation type multilayer quantum well structure having a plurality of quantum well layer and a plurality of barrier layers, each of the quantum well layers being constituted of a semiconductor crystal subjected to intraplanar compressive strain, each of said barrier layers being constituted of a semiconductor crystal of AlInAs, AlGaInAs or AlGaInAsP, characterized in that each of the quantum well layers has a thickness equal to or smaller than 6 nm and the total thickness of the quantum well layers is between 13 and 1,000 nm.

A semiconductive light-emitting device according to the present invention have a vertical or horizontal current injection structure. If it has a vertical current injection structure, the total thickness of the quantum well layers of the light-emitting layer is preferably between 13 and 300 nm, and most preferably between 40 and 70 nm. If, on the other hand, it has a horizontal current injection structure, the total thickness of the quantum well layers of the light-emitting layer is preferably between 13 and 300 nm, and most preferably between 40 and 70 nm. If a semiconductive light-emitting device according to the invention comprises a light-emitting layer of a strain compensation type multilayer quantum well structure having a plurality of quantum well layers and a plurality of barrier layers, the compression strain ratio of the quantum well layer is preferably between 0.8 and 1.5% and the tension strain ratio of the barrier layers is preferably between 0.4 and 0.8%.

The light-emitting layer of a semiconductive light-emitting device according to the invention may have a buried hetero-type striped structure or a ridge type waveguide structure. Additionally, the light emitting layer of a semiconductive light-emitting device according to the invention may be sandwiched by a pair of current confining layers along a direction perpendicular to the light path of the light-emitting layer.

A semiconductive light-emitting device according to the invention may have a Bragg's reflector disposed at the light-emitting edge of the light-emitting layer along the direction of light emission.

Alternatively, a semiconductive light-emitting device according to the invention may comprise a light-emitting layer, a pair of vertically arranged optical confining layers and a pair of vertically arranged cladding layers arranged on a semiconductor substrate, the upper and lower cladding being disposed on the upper optical confining layer and beneath the lower optical confining layer respectively to form an SCH structure. The SCH structure may be either a stepped SCH structure or a GRIN-SCH structure.

If a semiconductive light-emitting device according to the invention has such an alternative configuration, either or both of the upper and lower optical confining layer may include a DFB having a diffraction grating or may include a multilayer quantum barrier.

A semiconductive light-emitting device according to the invention typically has a light-emission wavelength band between 1.30 and 1.65 $\mu$m.

In a semiconductive light-emitting device according to the invention, each quantum well layer constituting part of the light-emitting layer (of a multilayer strained quantum well structure or a strain compensation type quantum multilayer quantum well structure) is subjected to intraplanar compression strain and each of the barrier layer constituting the rest of the light-emitting layer is made of AlInAs, AlGaInAs or AlGaInAsP. Each of the quantum well layers has a thickness equal to or smaller than 6 nm and the total thickness of the quantum well layers is between 13 and 1,000 nm. A semiconductive light-emitting device having such a configuration can produce a differential gain as large as $1 \sim 3 \times 10^{-15}$ cm$^2$ and a multiquantum well layer with a relatively large total thickness can be fabricated with ease.

Additionally, a semiconductive light-emitting device having such a configuration has a band offset $[\Delta E_c/(\Delta Ec+(\Delta E_v)]$ as large as 0.7 and hence the effective barrier height should have a large value. Consequently, as for such a semiconductive light-emitting device, the probability with which the injected electrons are released from the quantum well layers toward the barrier layers and optical confinement layers due to thermal emission decreases, thereby raising the differential gain as anticipated.

Moreover, thinner quantum well layers are provided for a semiconductive light-emitting device according to the present invention, where a quantum effect becomes large and a gain gradient to injected carrier density increases, thereby producing a fairly large differential gain.

Finally, since each of the quantum well layers of a semiconductor light-emitting device according to the invention has a small thickness, the ratio of the quantum effect or the gain to the carrier injection density shows a sharp increase to produce a sufficiently large differential gain.

DETAILED DESCRIPTION OF THE PREFERRED EMBODIMENTS

Now, the present invention is described by referring to the accompanying drawings that illustrate a preferred embodiment of semiconductor light emitting device according to the invention.

Figure 1:
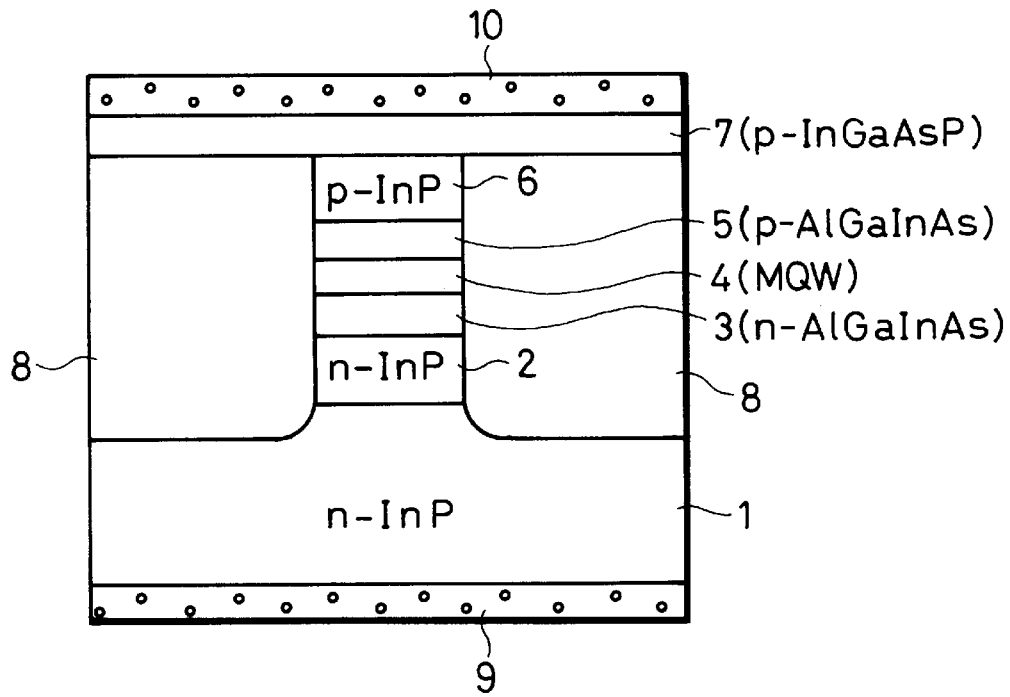
FIG. 1 is a schematic cross sectional view of an embodiment of semiconductive light-emitting device according to the invention.

Referring firstly to FIG. 1 schematically showing the embodiment, it comprises a substrate 1, a lower cladding layer 2, a lower optical confining layer 3, a strain compensation type multilayer quantum well structure 4, an upper optical confining layer 5, an upper cladding layer 6, a contact layer 7, a pair of current confining layers 8, 8, a cathode 9 and an anode 10.

The materials of the components of the semiconductive light-emitting device of FIG. 1 is described below. The substrate 1 is made of n-InP. The lower and upper cladding layers 2 and 6 are respectively made of n-InP and p-InP. The lower and upper optical confining layers 3 and 5 are respectively made of n-AlGaInAs and p-AlGaInAs. The strain compensation type multilayer quantum well structure 4 is described further onward. The contact layer 7 is made of p-InGaAsP. The paired current confining layers 8 are made of an Fe-doped InP semi-insulating semiconductor. The cathode 9 is made of Au—Ge—Ni/Au while the anode 10 is made of Ti—Pt—Au or Au—Zn.

The strain compensation type multilayer quantum well structure (MQW) 4 has a plurality of quantum well layers and a plurality of barrier layers, which alternate one on the other. Each of the quantum well layers is made of a semiconductor crystal (mixed crystal) selected from AlGaAs, GaInAs, AlGaInP, AlGaInAs and other semiconductors. Each of the barrier layers is made of a semiconductor crystal (mixed crystal) selected from AlGaInAs, AlGaInAs and other semiconductive s. For instance, the strain compensation type multilayer quantum well structure 4 may comprise a plurality of GaInAs quantum well layers and a plurality of AlGaInAs barrier layers that alternate on a one on the other basis. In the strain compensation type multilayer quantum well structure 4, each of the quantum well layers is subjected to intraplanar compression strain to a strain ratio between 0.4 and 3%, preferably between 0.8 and 1.5%, whereas each of the barrier layers is subjected to intraplanar tensile strain to a strain ratio between 0.4 and 0.8%. If the quantum well layers and the barrier layers of the strain compensation type multilayer quantum well structure 4 respectively show the above defined compression strain and tension strain ratios, the compressive strain of each of the quantum well layers is compensated by the tensile strain of the related barrier layer(s) so that the strains as a whole may be effectively compensated. Additionally, the compensation of the quantum well layer and the barrier layers are preferable to be selected so that the conduction band offset energy between the barrier layer and the optical confinement layer is less than $3k_zT$, where the energy gap of the barrier layer is larger than that of the optical confining layer. Each thickness of the quantum well layers of the strain compensation type multilayer quantum well structure 4 is between 1.0 and 30 nm and the total thickness of the layers is set between 13 and 1,000 nm, because a differential gain as large as $1 \times 10^{-15}$ cm$^2$ can be achieved with the currently available technology if the total thickness is greater than 13 nm and a multilayer quantum well structure can be prepared without difficulty if the total thickness if less than 1,000 nm. While a multilayer quantum well structure having a total thickness generously exceeding 1,000 nm may be prepared without significant difficulty, such a large thickness is of no significance for practical applications. The lower limit for the total thickness of the quantum well layers will be somewhere around 13 nm in order to ensure a high differential gain, whereas the upper limit will be 300 nm or so in view of the easiness to allow a multilayer quantum well structure having a large number of layers to be prepared.

For a semiconductive light-emitting device having a vertical current injection structure, such as a semiconductor buried heterojunction striped structure, the total thickness of the quantum well layers will be most preferably between 40 and 70 nm. The lower limit represents a value that produces a differential gain close to the theoretically achievable level, whereas the upper limit is found within the diffusion length of holes in order to ensure an even hole injection for a device having a vertical current injection structure.

On the other hand, for a semiconductive light-emitting device having a horizontal current injection structure, the total thickness of the quantum well layers will be most preferably between 40 and 300 nm, because, in this case, there is no problem about uneven hole injection mentioned above.

While no limits are provided for the thickness of each barrier layer of the strain compensation type multilayer quantum well structure 4, it may preferably found between 6 and 10 nm for the convenience' sake.

Referring to the semiconductive light-emitting devices of FIG. 1, the lower cladding layer 2, the lower optical confining layer 3, the strain compensation type multilayer quantum well structure 4, the upper optical confining layer 5 and the upper cladding layer 6 have a relatively narrow width and sequentially laid on a central portion of the substrate 1. On the other hand, the paired current confining layers 8 are formed to sandwich the layers 2 through 6. The contact layer 7 is laid on the upper cladding layer 6 and the paired current confining layers 8 that are arranged to show a same level. Otherwise, the cathode 9 is deposited to the lower surface of the substrate 1 while the anode 10 is deposited to the upper surface of the contact layer 7.

Figure 2:
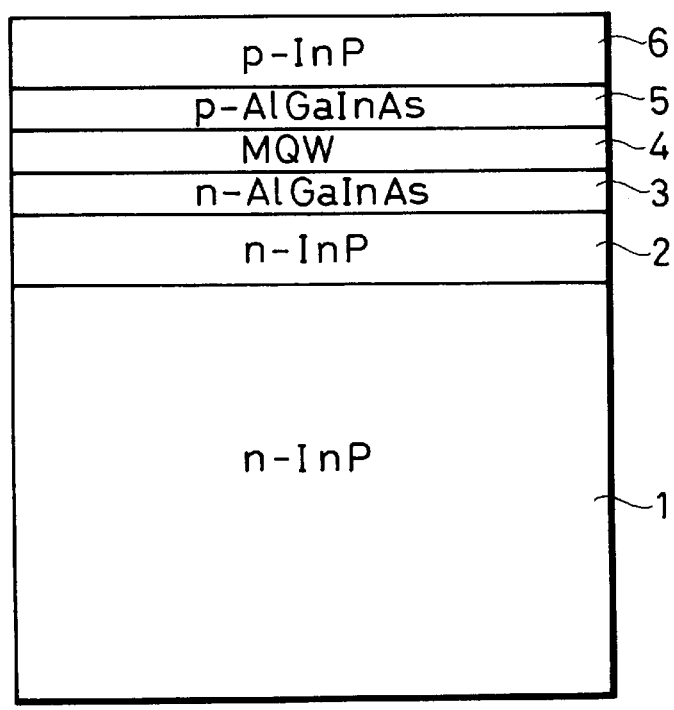
FIGS. 2 and 3 are schematic cross-sectional views of the embodiment of FIG. 1, illustrating different manufacturing steps thereof.
Figure 3:
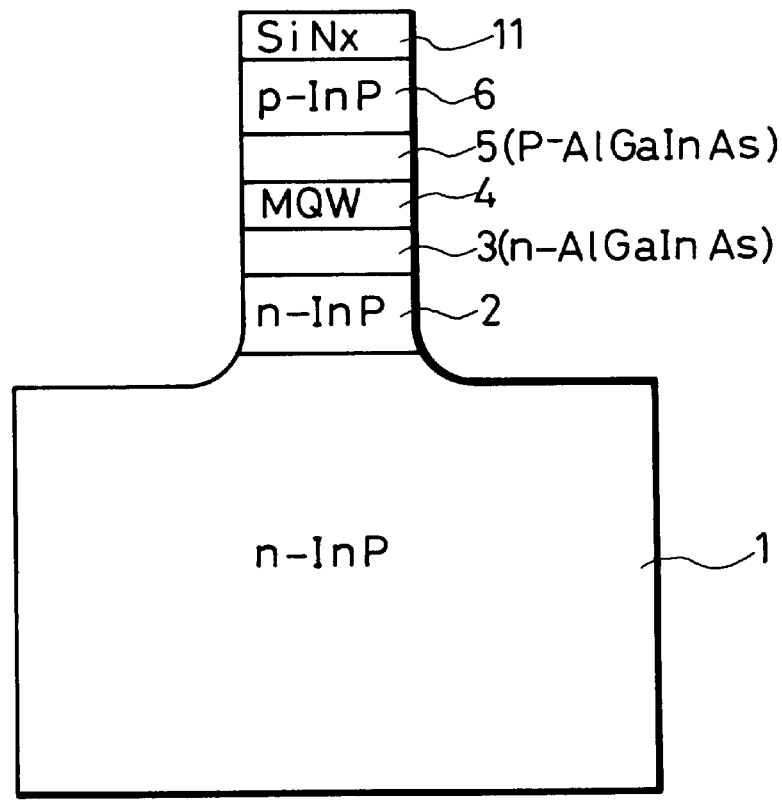

The semiconductive light-emitting device of FIG. 1 may typically be prepared by a manufacturing process including the steps schematically illustrated in FIGS. 2 and 3. Now, the process is described below.

Referring to FIG. 2, n-InP substrate 1 includes $2 \times 10^{18}$ n-type impurities per 1 cm$^2$. On the n-InP substrate 1, one selected out of MBE, gas source MBE, CBE and MOCVD methods stratifies in sequence, n-InP lower cladding layer 2 (1 μm thick, including $1 \times 10^{18}$ n-type impurities per 1 cm$^3$), n-Al$_{0.30}$Ga$_{0.17}$In$_{0.53}$As lower confinement layer 3 (50–200 nm thick, including $2 \times 10^{17}$ n-type impurities per 1 cm$^3$), strain compensation multilayer quantum well structure 4 described onward, p-$Al_{0.30}Ga_{0.17}In_{0.53}As$ upper confinement layer 5 (50–200 nm thick, including $2\times10^{17}$ p-type impurities per 1 $cm^3$) and p-InP upper cladding layer 6 (1 μm thick, including $1\times10^{18}$ p-type impurities per 1 $cm^3$).

The strain compensation type multilayer quantum well structure 4 is realized by alternately arranging a total of twelve quantum well layers, each being 5.2 nm thick, and a total of 13 barrier layers, each having a thickness of 8 nm. Each of the quantum well layers is subjected to compression strain of 1.0%, whereas each of the barrier layers is subjected to tension strain of 0.58%. The emission wavelength of MQW is 1.55 μm.

Referring now to FIG. 3, a dielectric film (typically made of $SiN_x$) or a mask 11 having a width between 1 and 2 μm and a thickness of 2,000 Å is formed on the p-InP upper cladding layer 6 typically by means of plasma CVD. Thereafter, lateral portions of the upper cladding layer 6, the upper optical confining layer 5, the strain compensation type multilayer quantum well structure 4, the lower light-confining layer 3, the lower cladding layer 2 and an upper portion of the substrate 1 that are not covered by the mask 11 are removed by means of a known etching technique.

Then, the void areas on the substrate 1 produced by the above etching operation are filled with an Fe-doped InP semi-insulating semiconductor material to produce a pair of symmetrically arranged current confining layers 8. The upper surface of the current confining layers 8 are found substantially on the level with that of the upper cladding layer 6. Subsequently, the mask 11 is removed by means of a known etching technique and a 0.4 nm thick p-InGaAsP contact layer 7 containing p-type impurities to a concentration of $3\times10^{19}$ particles per $cm^3$ is formed on the entire upper surfaces of the upper cladding layer 6 and the paired current confining layers 8, 8.

The substrate 1 is then scraped to reduce its thickness to about 100 μm as seen from FIG. 1. A 2,000 Å thick cathode 9 made of Au—Ge—Ni/Au is deposited to the lower surface of the scraped substrate 1 by means of a known metal deposition technique, while a 2,000 Å thick anode 10 made of Ti—Pt—Au or Au—Zn is bonded to the upper surface of the contact layer 7 also by means of a known metal deposition technique.

A multilayer product obtained by following the above manufacturing steps is then cleaved along a direction parallel to the surface of FIG. 1 to produce a semiconductive light-emitting device having a light emitting layer of a strain compensation type multilayer quantum well structure 4 (with an emission wavelength of 1.55 μm) as illustrated in FIG. 1.

Figure 4:
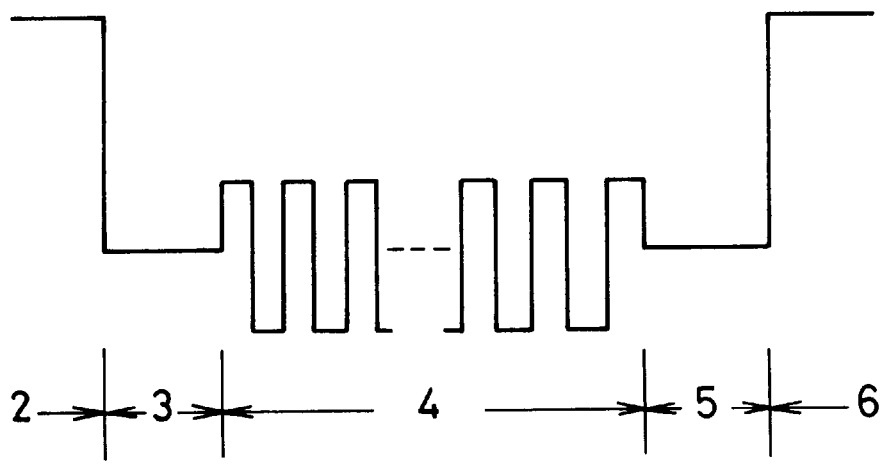
FIG. 4 is a conductive band energy diagram of a semiconductive light-emitting device according to the invention.

FIG. 4 is a energy band diagram of the conduction band of a semiconductive light-emitting device having a configuration as shown in FIG. 1, which produces a differential gain of approximately $30\times10^{-16}$ $cm^2$.

In the second embodiment (not shown) of semiconductive light-emitting device according to the invention, the strained compensation type multilayer quantum well structure of the light-emitting layer of the above embodiment is replaced by a multilayer strain quantum well structure. The configuration of such a semiconductive light-emitting device maybe exactly the same as that of the device of FIG. 1 except that the light emitting layer has a multilayer strained quantum well structure.

The multilayer strained quantum well structure of the second embodiment also comprises a plurality of quantum well layers and a plurality of barrier layers arranged alternately and each of the quantum well layers is made of a semiconductor crystal that is subjected to intraplanar compressive strain while each of the barrier layers is made of a semiconductor crystal of AlInAs, AlGaInAs or AlGaInAsP.

Therefore, all the above description concerning the technological aspects of the first embodiment of semiconductive light-emitting device (and FIGS. 1 through 4) applies to the second embodiment comprising a light-emitting layer having a multilayer strained quantum well structure within the scope of technological commonness, technological compatibility and modifiability of the design.

Figure 5:
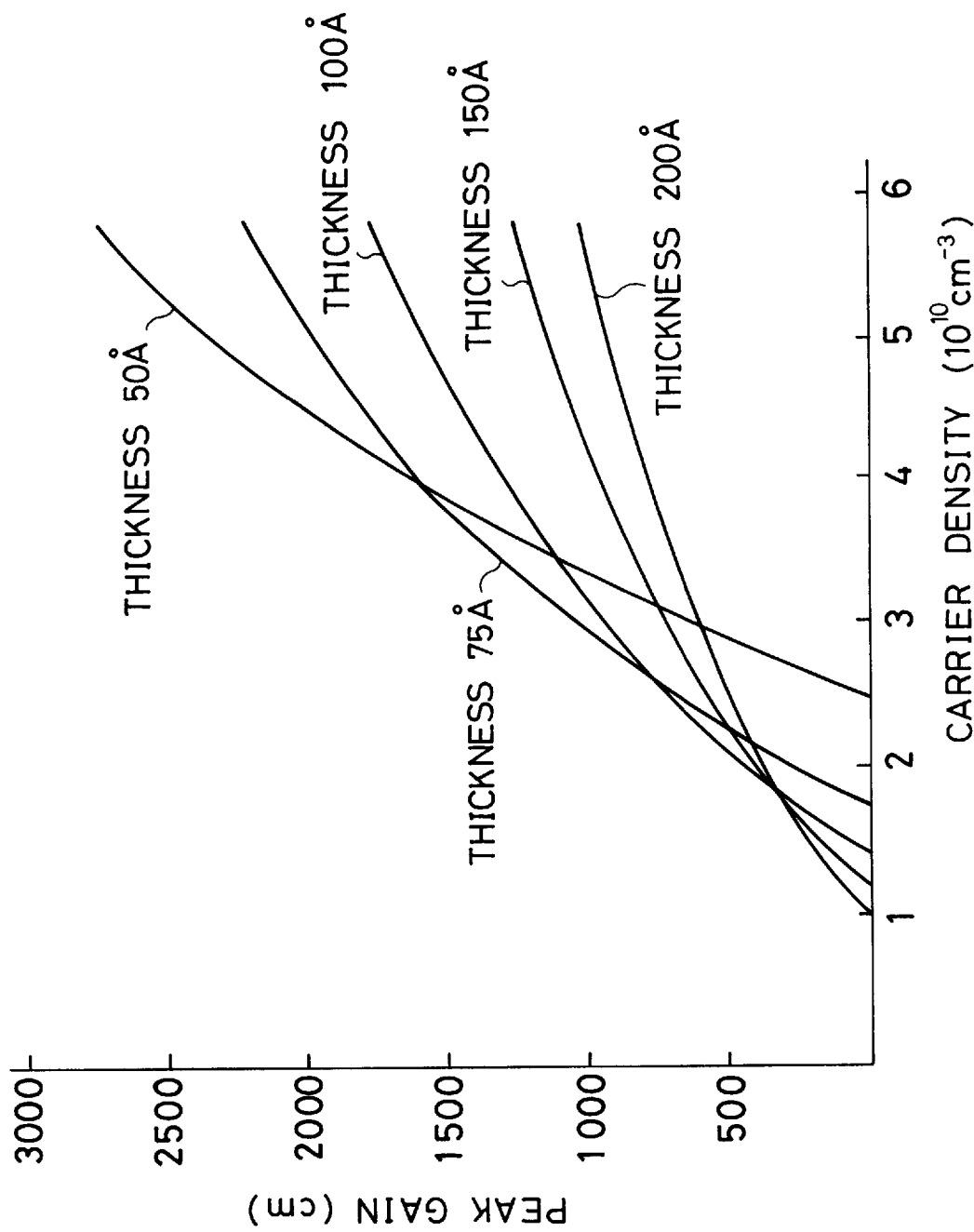
FIG. 5 is a graph illustrating the relationship between the peak gain and the carrier density for different thicknesses of the quantum well layers of a latticematching type multilayer quantum well laser.

FIG. 5 is a graph illustrating the relationship between the peak gain and the carrier density for different thicknesses of the quantum well layers of a GaInAsP/InP lattice matching type multilayer quantum well laser having a 1.3 μm wavelength band. As seen from FIG. 5, a relatively large differential gain is achieved when each of the quantum well layers of the light-emitting layer is equal to or smaller than 6 nm because the ratio of the gain to the injected carrier density shows a sharp increase.

Figure 6:
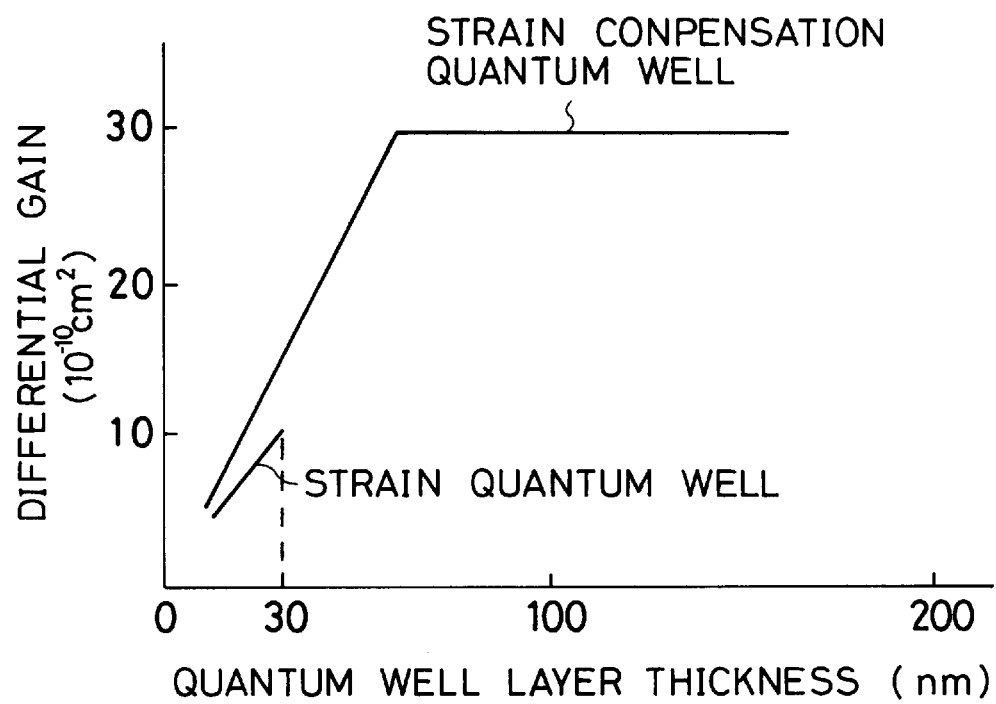
FIG. 6 is a graph illustrating the relationship between the total thickness of the quantum well layers and the differential gain of the first embodiment and that of the second embodiment of semiconductive light-emitting device according to the invention.
Figure 7:
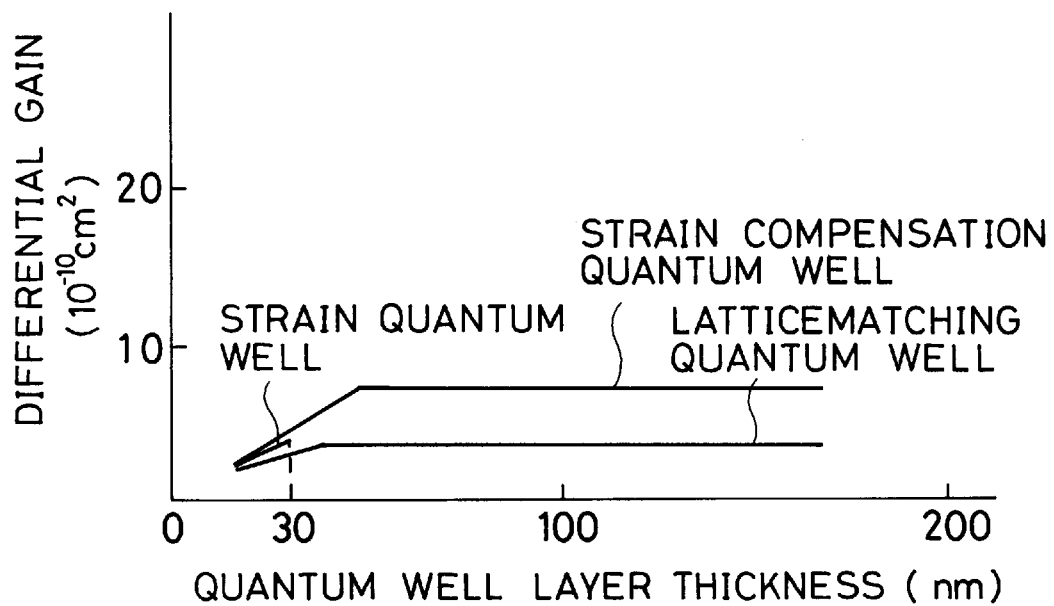
FIG. 7 is a graph similar to that of FIG. 6 but illustrating the the relationship between the total thickness of the quantum well layers and the differential gain of a known semiconductive light-emitting device.

FIG. 6 is a graph illustrating the relationship between the total thickness of the quantum well layers and the differential gain of the first embodiment and that of the second embodiment of a semiconductive light-emitting device according to the invention. As seen from FIG. 6, the differential gain shows a maximum value of $12\times10^{-16}$ $cm^2$ when the total thickness of the quantum well layers is equal to 30 nm or slightly below the critical film thickness in a semiconductive light-emitting device comprising a light-emitting layer of a multilayer strained quantum well structure, whereas the differential gain shows a maximum value of $30\times10^{-16}$ $cm^2$ when the total thickness of the quantum well layers is between 60 and 160 nm in a semiconductive light-emitting device comprising a light-emitting layer of a strain compensation type quantum well structure.

For the purpose of the invention, the strain compensation type multilayer quantum well structure (light emitting layer), if applicable, may be a buried type striped heterostructure. Alternatively, the light emitting layer may have a ridge type waveguide structure or may be sandwiched by a pair of semi-insulating current confining layers along a direction perpendicular to that of the light path of the light-emitting layer. Still alternatively, a distribution type Bragg's reflector may be disposed at the light-emitting end surface of the light-emitting layer along the direction of light emission. If a semiconductive light-emitting device according to the invention comprises a light-emitting layer, a pair of vertically arranged optical confining layers and a pair of vertically arranged cladding layers arranged on a semiconductor substrate, the upper and lower cladding layers being disposed on the upper optical confining layer and under the lower optical confining layer respectively, they may form an SCH structure. The SCH structure may be either a stepped SCH structure or a GRIN-SCH structure. If a semiconductive light-emitting device according to the invention has such an alternative configuration, either or both of the upper and lower optical confining layer may include a DFB having a diffraction grating or a multilayer quantum barrier.

Advantages of the Invention

In the present invention as detailed above, a semiconductive light-emitting device involving a light-emitting layer in which either a multilayer strained quantum well structure or a strain compensation multilayer quantum well structure is included, is thicker in summed layers, and higher in effective barrier layers, where a less probability, with which, the injected electrons are released, from the quantum well layers, toward the barrier layers and optical confinement layers due to thermal emission, results in an adequately raised differential gain.

What is claimed is:

1. A semiconductive light-emitting device comprising a light-emitting layer with a strained quantum well structure including a plurality of quantum well layers measuring greater than 60 nm and up to 1,000 nm in total thickness, and a plurality of barrier layers therein, each of said quantum well layers being constituted of a semiconductive crystal not exceeding 6 nm in thickness and being subjected to intraplanar compressive strain, each of said barrier layers being constituted of any one of AlInAs, AlGaInAs and AlGaInAsP.

2. A semiconductive light-emitting device comprising a light-emitting layer with a strain compensation type multilayer quantum well structure including a plurality of quantum well layers measuring greater than 60 nm and up to 1000 nm in total thickness, and a plurality of barrier layers therein, each of said quantum well layers being constituted of a semiconductor crystal not exceeding 6 nm in thickness and being subjected to intraplanar compressive strain, each of said barrier layers being constituted of any one of AlInAs, AlGaInAs and AlGaInAsP.

3. A semiconductive light-emitting device according to claim 1, wherein a vertical current injection structure is incorporated.

4. A semiconductive light-emitting device according to claim 1, wherein a horizontal current injection structure is incorporated.

5. A semiconductive light-emitting device according to claim 1, wherein said light-emitting layer is sandwiched by a pair of current confining layers as perpendicular to the light pathway in said light-emitting layer.

6. A semiconductive light-emitting device according to claim 1, wherein said light-emitting layer forms a buried stripe type heterostructure.

7. A semiconductive light-emitting device according to claim 1, wherein said light-emitting layer forms a ridge type waveguide structure.

8. A semiconductive light-emitting device according to claim 1, wherein a Bragg's reflector is disposed at the light-emitting end in said light-emitting layer along the light pathway.

9. A semiconductive light-emitting device according to claim 1, further comprising a pair of upper and lower light-confining layers, a pair of upper and lower cladding layers mounted on a semiconductive substrate, said upper and lower cladding layers being designed to be laid on said upper optical confining layers and beneath the lower optical confining layers, respectively, forming an SCH structure, said light-emitting layer being sandwiched between said upper and lower light-confining layers.

10. A semiconductive light-emitting device according to claim 2, wherein a ratio of compression strain is set between 0.8 and 1.5% for said quantum well layers; a ratio of tension strain is set between 0.4 and 0.8% for said barrier layers.

11. A semiconductive light-emitting device according to claim 1, wherein a total of said quantum well layers measures any value between 60 and 300 nm in thickness.

12. A semiconductive light-emitting device according to claim 3, wherein a total of said quantum well layers measures any value between 60 and 300 nm in thickness.

13. A semiconductive light-emitting device according to claim 4, wherein a total of said quantum well layers measures any value between 60 and 70 nm in thickness.

14. A semiconductive light-emitting device according to claim 9, wherein the SCH structure is stepped.

15. A semiconductive light-emitting device according to claim 9, wherein the SCH structure is of GRIN-SCH.

16. A semiconductive light-emitting device according to claim 9, wherein at least one of said upper and lower light-confining layers includes a DFB having a diffraction grating.

17. A semiconductive light-emitting device according to claim 9, wherein at least one of said upper and lower light-confining layers includes a multilayer quantum barrier.

* * * * *